(12) United States Patent
Ando et al.

(10) Patent No.: US 10,896,962 B2
(45) Date of Patent: Jan. 19, 2021

(54) ASYMMETRIC THRESHOLD VOLTAGES IN SEMICONDUCTOR DEVICES

(71) Applicant: INTERNATIONAL BUSINESS MACHINES CORPORATION, Armonk, NY (US)

(72) Inventors: Takashi Ando, Tuckahoe, NY (US); Alexander Reznicek, Troy, NY (US); Jingyun Zhang, Albany, NY (US); Choonghyun Lee, Rensselaer, NY (US); Pouya Hashemi, Purchase, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/425,165

(22) Filed: May 29, 2019

(65) Prior Publication Data

US 2020/0381520 A1 Dec. 3, 2020

(51) Int. Cl.
*H01L 29/40* (2006.01)
*H01L 29/78* (2006.01)
*H01L 29/49* (2006.01)
*H01L 29/51* (2006.01)
*H01L 29/66* (2006.01)
(Continued)

(52) U.S. Cl.
CPC ...... *H01L 29/408* (2013.01); *H01L 21/02186* (2013.01); *H01L 21/31122* (2013.01); *H01L 29/4983* (2013.01); *H01L 29/517* (2013.01); *H01L 29/6653* (2013.01); *H01L 29/6656* (2013.01); *H01L 29/66545* (2013.01); *H01L 29/66553* (2013.01); *H01L 29/66795* (2013.01); *H01L 29/7851* (2013.01)

(58) Field of Classification Search
CPC ............ H01L 29/6653; H01L 29/6656; H01L 29/66795; H01L 21/02186
See application file for complete search history.

(56) References Cited

U.S. PATENT DOCUMENTS

| 5,801,416 A | 9/1998 | Choi et al. |
| 6,127,235 A | 10/2000 | Gardner et al. |
| 7,999,332 B2 | 8/2011 | Yuan et al. |

(Continued)

FOREIGN PATENT DOCUMENTS

KR 20040055157 6/2004

OTHER PUBLICATIONS

Ki-Ju Baek et al., "Device Optimization of N-Channel MOSFETs with Lateral Asymmetric Channel Doping Profiles", Transactions on Electrical and Electronic Materials, Feb. 25, 2010, pp. 15-19, vol. 11, No. 1.

(Continued)

*Primary Examiner* — Hsien Ming Lee
(74) *Attorney, Agent, or Firm* — Tutunjian & Bitetto, P.C.; Robert Sullivan

(57) ABSTRACT

Semiconductor devices and methods of forming the same include forming an inner spacer on a semiconductor fin. Two outer spacers are formed around the inner spacer, with one outer spacer being in contact with the inner spacer and with the other outer spacer being separated from the inner spacer by a gap. A dipole-forming layer is formed on the semiconductor fin in the gap. The inner spacer is etched away. A gate stack is formed on the semiconductor fin, between the outer spacers.

20 Claims, 5 Drawing Sheets

(51) Int. Cl.
     *H01L 21/02*      (2006.01)
     *H01L 21/311*     (2006.01)

(56) References Cited

U.S. PATENT DOCUMENTS

| | | |
|---|---|---|
| 8,445,974 B2 | 5/2013 | Chidambarrao et al. |
| 9,859,122 B2 | 1/2018 | Chou et al. |
| 10,181,468 B2 | 1/2019 | Xu et al. |
| 2005/0205923 A1 | 9/2005 | Han et al. |
| 2017/0179261 A1* | 6/2017 | Xu .................... H01L 29/6684 |

OTHER PUBLICATIONS

Yongxun Liu et al., "Cointegration of High-Performance Tied-Gate Three-Terminal FinFETs and VariableThreshold-Voltage Independent-Gate Four-Terminal FinFETs With AsymmetricGate-Oxide Thicknesses", IEEE Electron Device Letters, Jun. 2007, vol. 28, No. 6.

K. Narasimhulu et al., "Impact of Lateral Asymmetric Channel Doping on Deep Submicrometer Mixed-Signal Device and Circuit Performance", IEEE Transactions on Electron Devices, Dec. 2003, vol. 50, No. 12.

\* cited by examiner

ASYMMETRIC THRESHOLD VOLTAGES IN SEMICONDUCTOR DEVICES

BACKGROUND

The present invention generally relates to the formation of semiconductor devices and, more particularly, to the fabrication of field effect transistors (FETs) that have asymmetric threshold voltages across the length of their channels.

In lateral asymmetric channel devices, an asymmetric doping profile is used to add more dopant on the source side of a device than on the drain side of the device. The channel potential at the source-side is much steeper than that of the other channel regions. The steep potential distribution near the source side enhances the lateral channel dielectric field and increases carrier mobility. However, this is difficult to achieve for short-channel devices.

SUMMARY

A method of forming a semiconductor device includes forming an inner spacer on a semiconductor fin. Two outer spacers are formed around the inner spacer, with one outer spacer being in contact with the inner spacer and with the other outer spacer being separated from the inner spacer by a gap. A dipole-forming layer is formed on the semiconductor fin in the gap. The inner spacer is etched away. A gate stack is formed on the semiconductor fin, between the outer spacers.

A method of An inner spacer is formed on a semiconductor fin. Two outer spacers are formed around the inner spacer, with one outer spacer being in contact with the inner spacer and with the other outer spacer being separated from the inner spacer by a gap. A dipole-forming layer is formed on the semiconductor fin in the gap from a material selected from the group consisting of an oxide of an IUPAC group 2 element, an oxide of an IUPAC group 3 element, and titanium oxide. The inner spacer is etched away. A gate stack is formed on the semiconductor fin, between the outer spacers, partially over the dipole-forming layer and partially in contact with the semiconductor fin, without the dipole-forming layer intervening.

A semiconductor device includes a semiconductor channel. A dipole-forming layer is on the semiconductor channel and covers less than the full semiconductor channel. A gate stack is formed over semiconductor channel, with a first portion of the gate stack being formed over the dipole-forming layer and a second portion of the gate stack having no dipole-forming layer under it.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide asymmetric threshold voltage field effect transistor (FET) devices by modifying a portion of the channel, near the drain side of the channel, with an interfacial dipole layer. Electric dipoles are formed at the interface between an interfacial layer on the channel and the interfacial dipole layer. Such electric dipoles serve as internal fields across gate dielectric and shift threshold voltages. In particular embodiments, dual spacers are used to provide a partial etch of a portion of the channel in a self-aligned manner. The ratio between the high threshold voltage region and the low threshold voltage region can be controlled by the thickness of an inner spacer.

Figure 1:
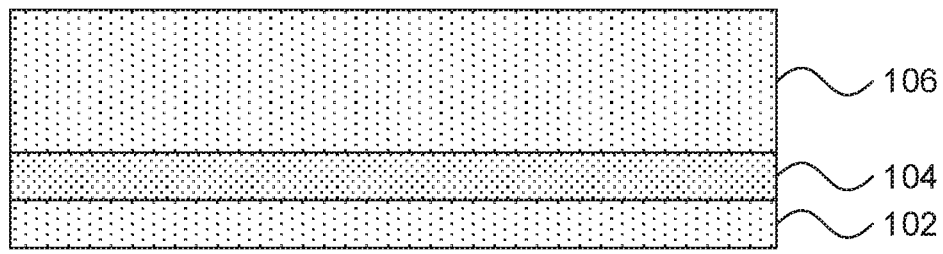
FIG. 1 is a cross-sectional view of a step in the formation of a semiconductor device with a channel region having differing threshold voltages that shows the formation of a semiconductor channel in accordance with an embodiment of the present invention.

Referring now to the drawings in which like numerals represent the same or similar elements and initially to FIG. 1, a cross-sectional view is shown of a step in the formation of a FET with asymmetrical voltage thresholds is shown. This view shows a cross-section that is taken parallel to, and through, a semiconductor fin 106. The semiconductor fin 106 is formed on a buried insulator layer 104, which in turn is on a bulk semiconductor substrate 102. Although the present embodiments are directed to semiconductor-on-insulator structures, it should be understood that the fin 106 can be formed from a bulk semiconductor substrate instead. The semiconductor fin 106 can be formed from a semiconductor layer using any appropriate fabrication process including, e.g., photolithography with a reactive ion etch (RIE). It should furthermore be understood that, although the present embodiments are described with particular focus on fin-based structures, the present principles can also be effectively applied to planar semiconductor architectures.

In one example, the semiconductor fin 106 can be formed from a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide.

RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation. Alternatively, structure the semiconductor fin 106 can be formed by spacer imaging transfer.

Figure 2:
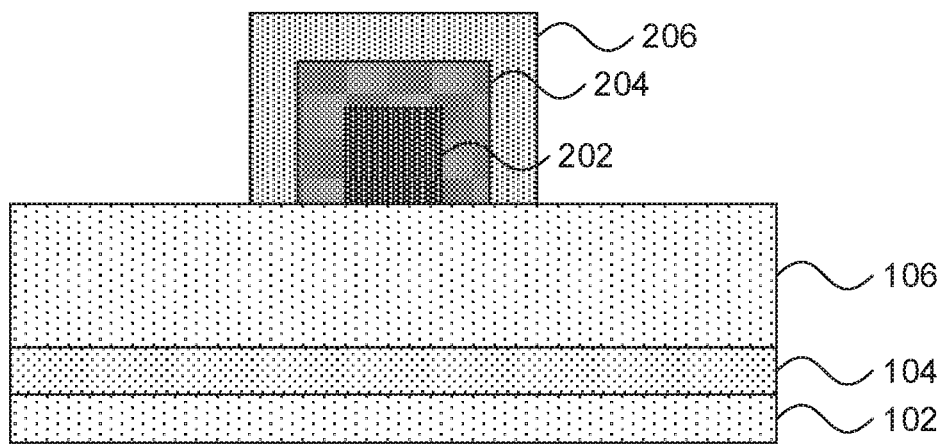
FIG. 2 is a cross-sectional view of a step in the formation of a semiconductor device with a channel region having differing threshold voltages that shows the formation of a dummy gate, a first spacer, and a second spacer on the channel in accordance with an embodiment of the present invention.

Referring now to FIG. 2, a cross-sectional view is shown of a step in the formation of a FET with asymmetrical voltage thresholds is shown. A dummy gate 202 is formed over the fin 106. The dummy gate 202 can be formed by any appropriate deposition process, followed by patterning and an anisotropic etch. An inner spacer 204 is then formed conformally over the dummy gate 202, followed by an outer spacer 206.

The inner spacer 204 and the outer spacer 206 can be formed of any appropriate materials that have etch selectivity with respect to one another. As used herein, the term "selective" in reference to a material removal process denotes that the rate of material removal for a first material is greater than the rate of removal for at least another material of the structure to which the material removal process is being applied. Thus, for example, the inner spacer 204 can be formed from silicon dioxide, while the outer spacer can be formed from silicon nitride.

In the depicted embodiments, the inner spacer 204 and the outer spacer 206 are shown as having been deposited by a conformal deposition process, such as chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

The thickness of the inner spacer 204 and the dummy gate 202 together determine the channel length of the final device. The outer spacer 206 will ultimately form gate sidewalls. In one exemplary embodiment, the dummy gate 202 can have a width of about 10 nm, while the inner spacer 204 can have a thickness of about 5 nm and the outer spacer can have a thickness of about 6 nm. The thickness of the inner spacer 204 determines the lengths of the channel regions at different voltage thresholds. Although these exemplary embodiments are contemplated to provide a channel that has about 25% of its length at a relatively high threshold voltage, it should be understood that other thicknesses can be used to provide different proportions between high threshold voltage regions and low threshold voltage regions.

Figure 3:
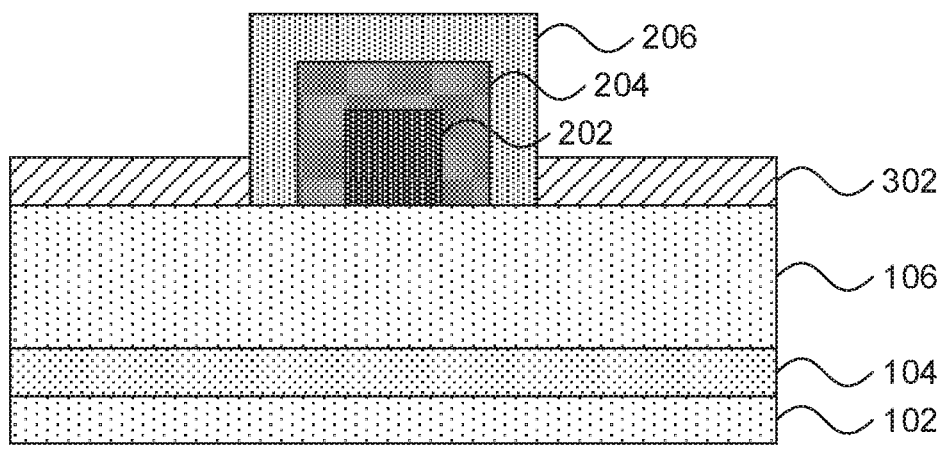
FIG. 3 is a cross-sectional view of a step in the formation of a semiconductor device with a channel region having differing threshold voltages that shows the formation of source and drain structures in accordance with an embodiment of the present invention.

Referring now to FIG. 3, a cross-sectional view is shown of a step in the formation of a FET with asymmetrical voltage thresholds is shown. Source and drain regions 302 are formed on the fin 106. It is specifically contemplated that the source and drain regions 302 can be formed by epitaxial growth of a material with a crystalline structure that is compatible with the material of the semiconductor fin 106. The source and drain regions 302 can be doped with any appropriate dopant, including n-type or p-type dopants. Doping can be performed in situ during the epitaxial growth or by ion implantation.

The terms "epitaxial growth" means the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

Figure 4:
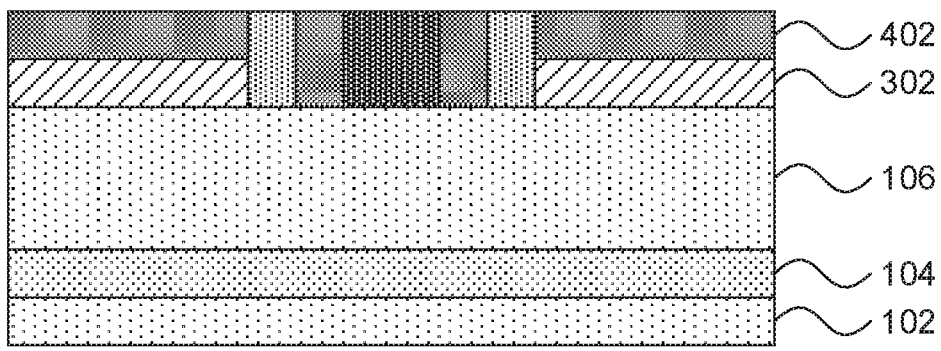
FIG. 4 is a cross-sectional view of a step in the formation of a semiconductor device with a channel region having differing threshold voltages that shows the exposure of the dummy gate in accordance with an embodiment of the present invention.

Referring now to FIG. 4, a cross-sectional view is shown of a step in the formation of a FET with asymmetrical voltage thresholds is shown. An interlayer dielectric material can be deposited using any appropriate process, such as CVD, ALD, PVD, or a spin-on deposition. The top surface is then polished down to the height of the dummy gate 202 using, e.g., a chemical mechanical planarization (CMP) process. CMP is performed using, e.g., a chemical or granular slurry and mechanical force to gradually remove upper layers of the device. The slurry may be formulated to be unable to dissolve, for example, the dummy gate material, resulting in the CMP process's inability to proceed any farther than that layer. Although CMP is specifically contemplated, other processes can be used instead to selectively etch the top surfaces of the outer spacer 206 and the inner spacer 204 to expose the dummy gate 202.

Figure 5:
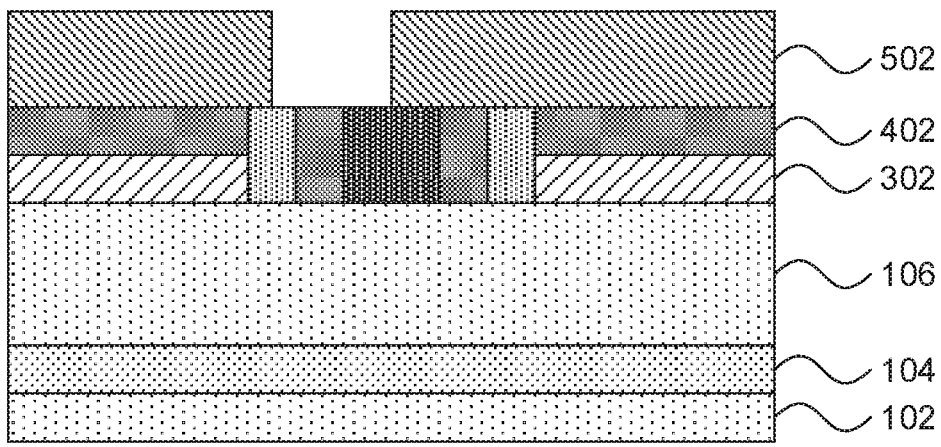
FIG. 5 is a cross-sectional view of a step in the formation of a semiconductor device with a channel region having differing threshold voltages that shows the formation of a mask over the dummy gate and one inner spacer in accordance with an embodiment of the present invention.

Referring now to FIG. 5, a cross-sectional view is shown of a step in the formation of a FET with asymmetrical voltage thresholds is shown. A mask 502 is formed over the device, with a gap exposing the dummy gate 202 and only one side of the remaining inner spacer 204. The mask 502 can be formed by any appropriate process, such as a photolithographic process that uses appropriate radiation to define a portion of a photoresist material to be removed. Because of the etch selectivity of the outer spacer 206 and the inner spacer 204, some mispositioning of the gap is tolerated.

Figure 6:
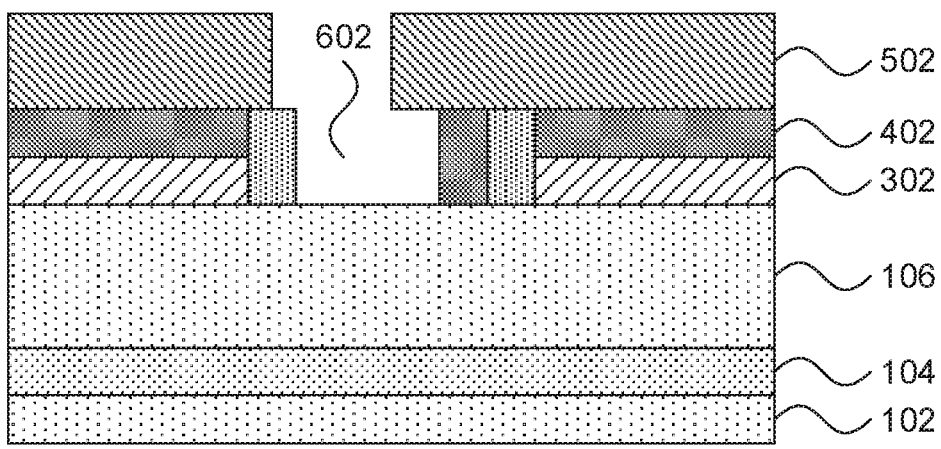
FIG. 6 is a cross-sectional view of a step in the formation of a semiconductor device with a channel region having differing threshold voltages that shows etching away the dummy gate and the exposed inner spacer in accordance with an embodiment of the present invention.

Referring now to FIG. 6, a cross-sectional view is shown of a step in the formation of a FET with asymmetrical voltage thresholds is shown. The dummy gate 202 and the exposed portion of the inner spacer 204 are etched away, leaving gap 602 that has the remaining portion of the inner spacer 204 on one side, covered by the mask 502. In some embodiments, the dummy gate 202 can be removed first by any appropriate isotropic etch, such that any portion of the dummy gate 202 that is covered by the mask 502 is removed, followed by an anisotropic etch of the exposed portion of the inner spacer 204. In other embodiments, the exposed portion of the inner spacer 204 can be removed first using any appropriate isotropic or anisotropic etch—the remainder of the inner spacer will be protected from that etch by the mask 502 and the dummy gate 202.

Figure 7:
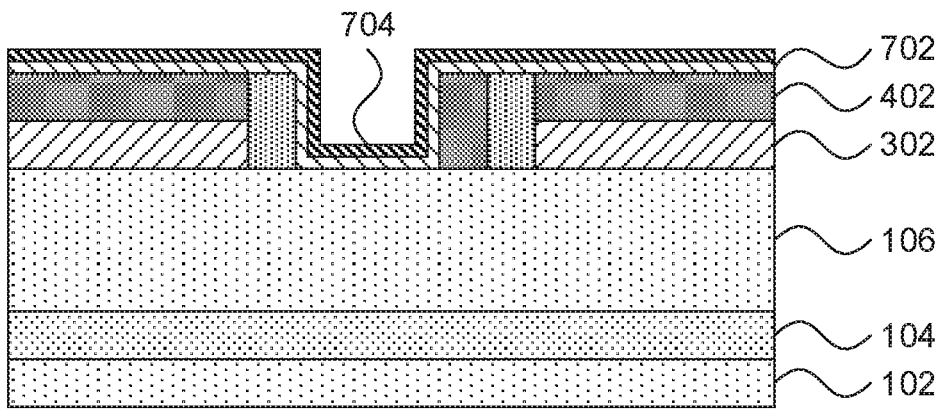
FIG. 7 is a cross-sectional view of a step in the formation of a semiconductor device with a channel region having differing threshold voltages that shows the formation of a dipole-forming material in accordance with an embodiment of the present invention.

Referring now to FIG. 7, a cross-sectional view is shown of a step in the formation of a FET with asymmetrical voltage thresholds is shown. The mask 502 is stripped away using any appropriate etch. A dipole-forming layer 702 is first formed over the fin 106 using a conformal deposition process. A protection layer 704 is then formed over the dipole-forming layer 702 using a conformal deposition process. In some embodiments it is contemplated that the dipole-forming layer 702 can be formed from a lanthanum oxide ($La_2O_3$) for n-type devices or from an aluminum oxide ($Al_2O_3$) for p-type devices. In general, for n-type devices, oxides of International Union of Pure and Applied Chemistry (IUPAC) groups 2 or 3 elements from the periodic table can be used, while for p-type devices, titanium oxide can be used. The protection metal can be formed from titanium nitride, though it should be understood that other materials can be used instead if they have appropriate etch selectivity in the subsequent processing steps.

Figure 8:
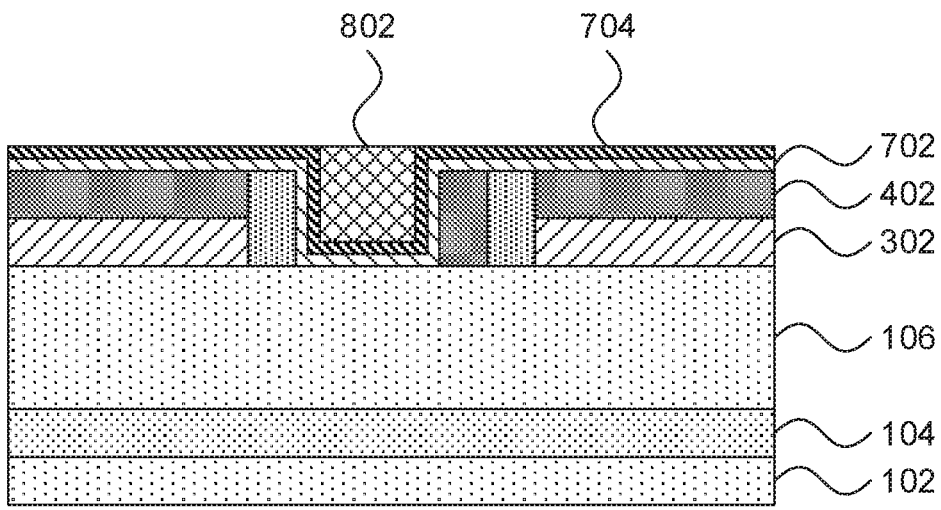
FIG. 8 is a cross-sectional view of a step in the formation of a semiconductor device with a channel region having differing threshold voltages that shows the formation of a protective layer in accordance with an embodiment of the present invention.

Referring now to FIG. 8, a cross-sectional view is shown of a step in the formation of a FET with asymmetrical voltage thresholds is shown. An organic planarizing layer (OPL) 802 is deposited over the protection layer 704 using any appropriate deposition process. Although it is specifically contemplated that an organic planarizing material can be used, it should be understood that any material with appropriate etch selectivity relative to the protection layer 704 and the dipole-forming layer 702 can be used instead. The OPL layer 802 can be polished down to the level of the protection layer 704 using, e.g., a CMP process.

Figure 9:
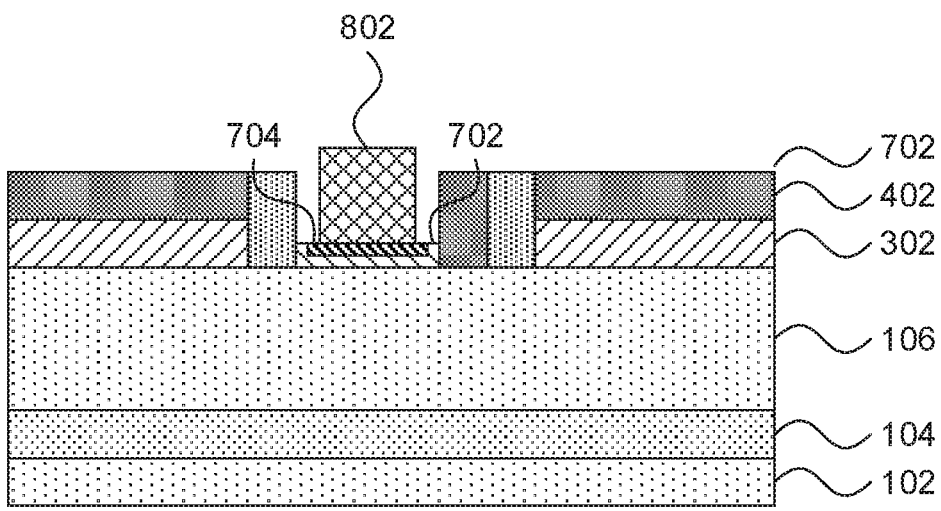
FIG. 9 is a cross-sectional view of a step in the formation of a semiconductor device with a channel region having differing threshold voltages that shows etching back the dipole-forming layer in accordance with an embodiment of the present invention.

Referring now to FIG. 9, a cross-sectional view is shown of a step in the formation of a FET with asymmetrical voltage thresholds is shown. The dipole-forming layer 702 and the protection layer 704 are etched back below the height of the interlayer dielectric 402 using one or more appropriate isotropic or anisotropic etches. The OPL 802 protects the bottom portion of the dipole-forming layer 702 and the protection layer 704 from the etch.

Figure 10:
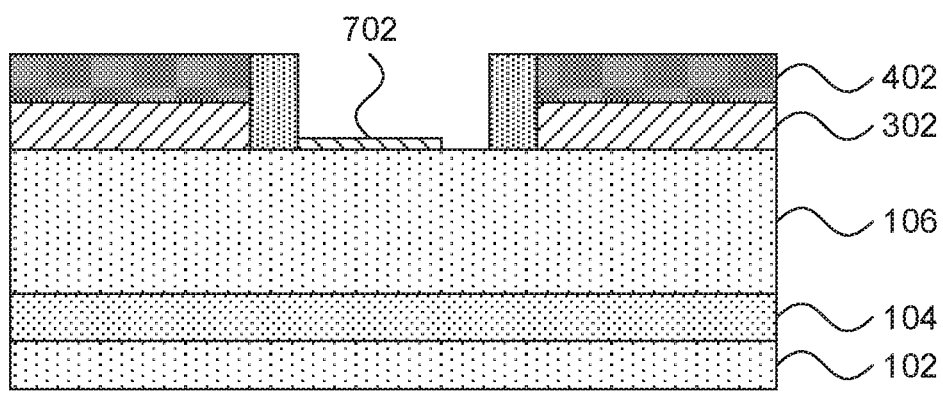
FIG. 10 is a cross-sectional view of a step in the formation of a semiconductor device with a channel region having differing threshold voltages that shows the removal of the protective layer and the remaining inner spacer in accordance with an embodiment of the present invention.

Referring now to FIG. 10, a cross-sectional view is shown of a step in the formation of a FET with asymmetrical voltage thresholds is shown. The OPL 802, the remaining inner spacer 204, and the protection layer 704 are etched away in one or more selective etches that leave the dipole-forming layer 702, the outer spacers 206, and the semiconductor fin 106 unharmed. The bottom portion of the dipole-forming layer remains on the semiconductor fin 106, but the removal of the remaining inner spacer 204 exposes a portion of the semiconductor fin 106 where there is no dipole-forming material present.

Figure 11:
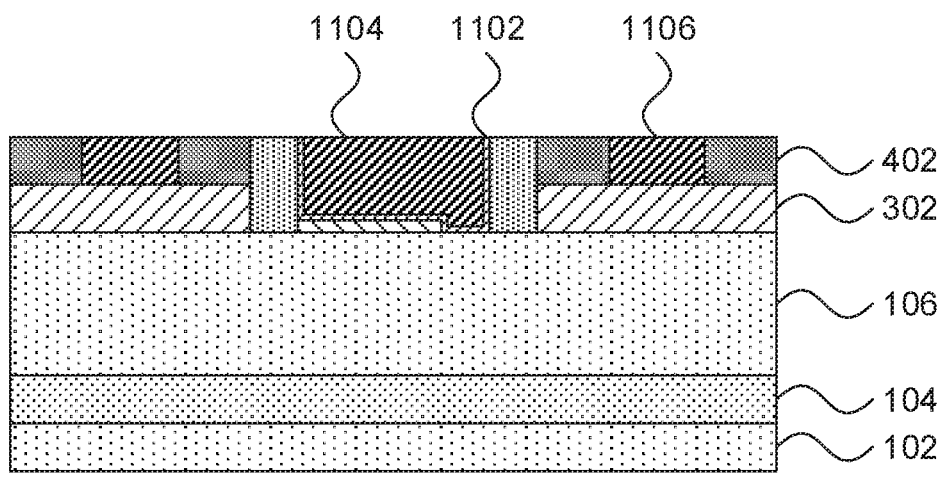
FIG. 11 is a cross-sectional view of a step in the formation of a semiconductor device with a channel region having differing threshold voltages that shows the formation of a gate stack in accordance with an embodiment of the present invention.

Referring now to FIG. 11, a cross-sectional view is shown of a step in the formation of a FET with asymmetrical voltage thresholds is shown. A gate stack is formed over the semiconductor fin 106 by forming a gate dielectric layer 1102 and a gate conductor 1104. The gate dielectric layer 1102 can be formed from any appropriate dielectric material, such as a high-k dielectric, and can be formed by any appropriate deposition process. The gate conductor 1104 can be formed from any appropriate conductive material. A work function layer (not shown) can optionally be included between the gate dielectric 1102 and the gate conductor 1104 in accordance with the design needs for the device. Contacts 1106 are formed through the interlayer dielectric 402 to make electrical contact with the source and drain regions 302 using any appropriate conductive material.

A high-k dielectric material is a material with a dielectric constant that is greater than that of silicon dioxide. Examples of high-k dielectric materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as lanthanum and aluminum.

The gate conductor 1104 may be formed from any appropriate conductive metal such as, e.g., tungsten, nickel, titanium, molybdenum, tantalum, copper, platinum, silver, gold, ruthenium, iridium, rhenium, rhodium, and alloys thereof. The gate conductor 1104 may alternatively be formed from a doped semiconductor material such as, e.g., doped polysilicon. Source/drain contacts 1106 can be formed by forming vias in the interlayer dielectric 402 and filling the vias with an appropriate conductive material to make electrical contact with the underling source and drain regions 302.

The distance between the outer spacers 206 define a channel region of the semiconductor fin 106. In one exemplary embodiment, the distance between the outer spacers 206 can be about 20 nm or less. In this exemplary embodiment, three quarters of the channel region is covered by the dipole-forming layer 702 and the remaining quarter is not. The portion of the channel region that is not covered by the dipole-forming layer 702 has a higher threshold voltage than the portion of the channel region that is covered by the dipole forming layer 702. It is specifically contemplated that the dipole-forming layer can cover between about 20% and about 50% of the channel region, though other amounts can be used instead.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "an" and "the" are intended to include the plural forms as well, unless the context clearly indicates otherwise. It will be further understood that the terms "comprises," "comprising," "includes" a d/or "including," used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's car feature's relations to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), the spatially relative descriptors used herein can be interpreted accordingly. In addition, it will also be understood that when a layer is referred to as being "between" layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 12:
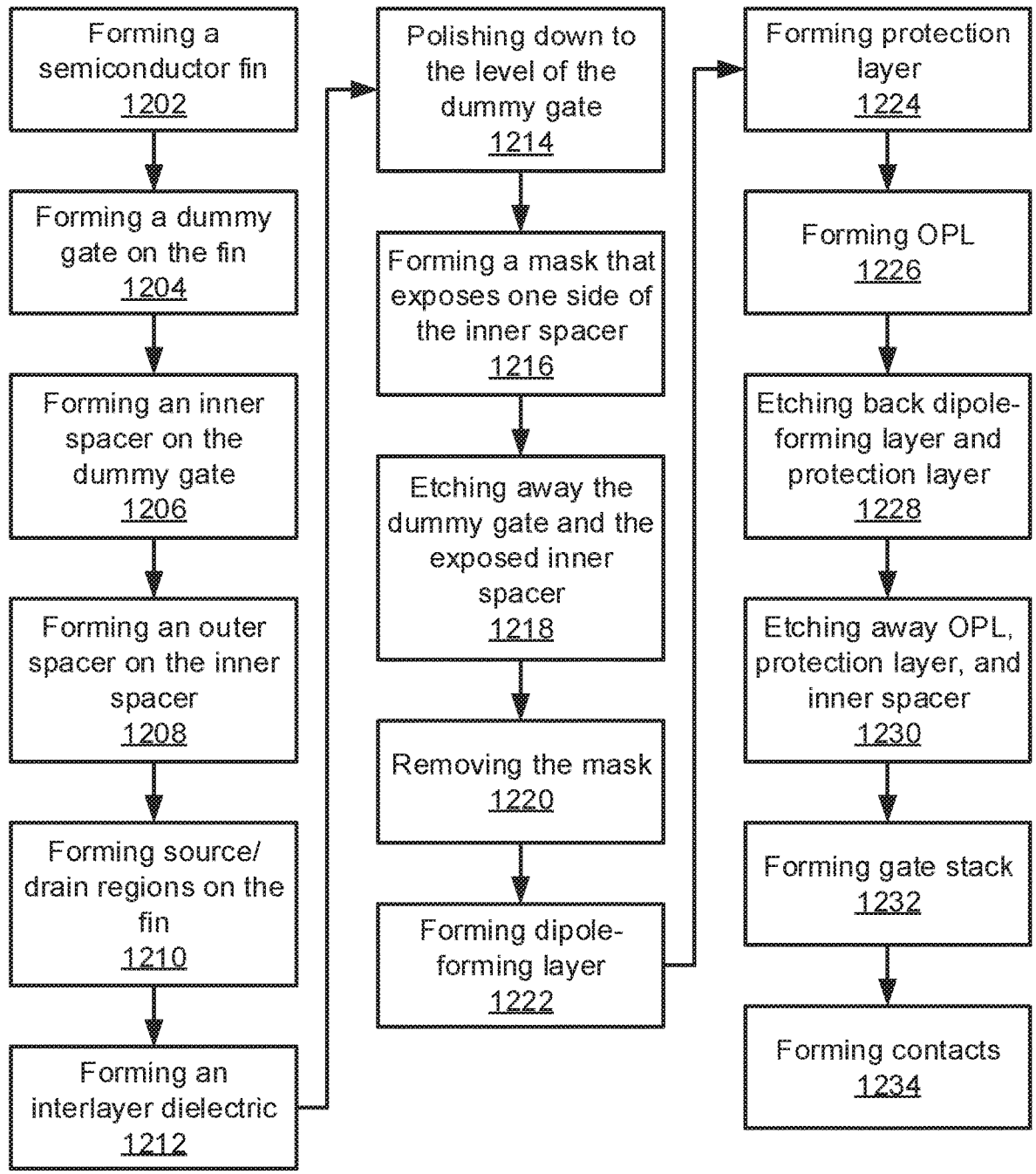
FIG. 12 is a block/flow diagram of a method of forming a semiconductor device with a channel region having differing threshold voltages in accordance with an embodiment of the present invention.

Referring now to FIG. 12, a method of forming a FET with asymmetrical voltage thresholds is shown. Block 1202 forms a semiconductor fin 106 by any appropriate means, including an anisotropic etch. Block 1204 forms a dummy gate 202 on the fin 106, block 1206 forms an inner spacer 204 on the dummy gate, and block 1208 forms outer spacer 206 on the inner spacer 204. Block 1210 forms source and drain regions 302 on the exposed portions of the semiconductor fin 106 by, e.g., epitaxial growth.

Block 1212 then forms an interlayer dielectric 402 on and around the semiconductor fin 106. Block 1214 polishes the top surface of the device down to the level of the top surface of the dummy gate 202 using, e.g., a CMP process. Block 1216 forms a mask 502 on the device. The mask 502 is patterned to expose one side of the inner spacer 204 and at least a portion of the dummy gate 202. Block 1218 then etches away the dummy gate 202 and the exposed portion of the inner spacer 204 using respective etches that preserve the unexposed portion of the inner spacer 204. Block 1220 removes the mask 502.

Block 1222 forms a dipole-forming layer over the exposed surfaces using any appropriate conformal deposition process. Block 1224 forms a protection layer 704 over the dipole-forming layer using another conformal deposition process. Block 1226 then fills a remaining gap with an organic planarizing layer 802 by depositing the OPL material and then polishing it down to expose the top surface of the protection layer 704.

Block 1228 etches back the dipole forming layer 702 and the protection layer 704 below the height of the OPL 802 using one or more appropriately selective etches. Block 1230 etches away the OPL 802, the remaining protection layer 704, and the remaining inner spacer 204 using one or more selective etches that leave a layer of the dipole-forming layer 702 on the semiconductor fin 106. Block 1232 forms a gate stack on the semiconductor fin 106, with a portion of the gate stack being formed over the remaining dipole-forming layer 702 and a portion being formed on the semiconductor fin 106 without any dipole-forming layer. Forming the gate stack can include forming a gate dielectric 1102 and a gate conductor 1104, optionally with a work function layer between them. Block 1234 forms conductive contacts to the source and drain regions 302.

Having described preferred embodiments of asymmetric threshold voltages in semiconductor devices (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a semiconductor device, comprising:
   forming an inner spacer on a semiconductor fin;
   forming two outer spacers around the inner spacer, with one outer spacer being in contact with the inner spacer and with the other outer spacer being separated from the inner spacer by a gap;
   forming a dipole-forming layer on the semiconductor fin in the gap;
   etching away the inner spacer; and
   forming a gate stack on the semiconductor fin, between the outer spacers.

2. The method of claim 1, wherein forming the inner spacer on the semiconductor fin comprises:
   forming a dummy gate on the semiconductor fin;
   foil ling an inner spacer layer on the dummy gate;
   polishing the inner spacer layer down to a height of a top surface of the dummy gate to separate the inner spacer layer into two inner spacers; and
   etching away one of the two inner spacers.

3. The method of claim 2, further comprising etching away the dummy gate, with a space left by etching away one of the inner spacers and by etching away the dummy gate forms the gap.

4. The method of claim 2, further comprising forming an outer spacer layer on the inner spacer layer, wherein polishing the inner spacer layer also polishes the outer spacer layer to form the two outer spacers.

5. The method of claim 1, wherein the gate stack is formed partially over the dipole-forming layer and partially in contact with the semiconductor fin, without the dipole-forming layer intervening.

6. The method of claim 1, wherein the dipole-forming layer covers between 50% and 80% of a region of the semiconductor fin between the outer spacers.

7. The method of claim 1, wherein forming the dipole-forming layer comprises:
   depositing a dipole-forming material in the gap;
   depositing a protective layer over the dipole-forming material in the gap;
   filling remaining space in the gap with an organic planarizing layer;
   etching back the dipole-forming material and the protective layer around the organic planarizing layer to leave a substantially horizontal dipole-forming layer on a bottom surface of the gap; and
   etching away the organic planarizing layer and the protective layer.

8. The method of claim 1, wherein the dipole-forming layer is formed from a material selected from the group consisting of an oxide of an International Union of Pure and Applied Chemistry (IUPAC) group 2 element, an oxide of an IUPAC group 3 element, and titanium oxide.

9. A method of forming a semiconductor device, comprising:
   forming an inner spacer on a semiconductor fin;
   forming two outer spacers around the inner spacer, with one outer spacer being in contact with the inner spacer and with the other outer spacer being separated from the inner spacer by a gap;
   forming a dipole-forming layer on the semiconductor fin in the gap from a material selected from the group consisting of an oxide of an International Union of Pure and Applied Chemistry (IUPAC) group 2 element, an oxide of an IUPAC group 3 element, and titanium oxide;
   etching away the inner spacer; and
   forming a gate stack on the semiconductor fin, between the outer spacers, partially over the dipole-forming layer and partially in contact with the semiconductor fin, without the dipole-forming layer intervening.

10. The method of claim 9, wherein forming the inner spacer on the semiconductor fin comprises:
    forming a dummy gate on the semiconductor fin;
    forming an inner spacer layer on the dummy gate;
    polishing the inner spacer layer down to a height of a top surface of the dummy gate to separate the inner spacer layer into two inner spacers; and
    etching away one of the two inner spacers.

11. The method of claim 10, further comprising etching away the dummy gate, with a space left by etching away one of the inner spacers and by etching away the dummy gate forms the gap.

12. The method of claim 10, further comprising forming an outer spacer layer on the inner spacer layer, wherein polishing the inner spacer layer also polishes the outer spacer layer to form the two outer spacers.

13. The method of claim 9, wherein the dipole-forming layer covers between 50% and 80% of a region of the semiconductor fin between the outer spacers.

14. The method of claim 9, wherein forming the dipole-forming layer comprises:
depositing a dipole-forming material in the gap;
depositing a protective layer over the dipole-forming material in the gap;
filling remaining space in the gap with an organic planarizing layer;
etching back the dipole-forming material and the protective layer around the organic planarizing layer to leave a substantially horizontal dipole-forming layer on a bottom surface of the gap; and
etching away the organic planarizing layer and the protective layer.

15. A semiconductor device, comprising:
a semiconductor channel;
a dipole-forming layer on the semiconductor channel that covers less than the full semiconductor channel; and
a gate stack formed over semiconductor channel, with a first portion of the gate stack being formed over the dipole-forming layer and a second portion of the gate stack having no dipole-forming layer under it.

16. The semiconductor device of claim 15, wherein the dipole-forming layer covers between 50% and 80% of the semiconductor channel.

17. The semiconductor device of claim 15, wherein the dipole-forming layer is formed from a material selected from the group consisting of an oxide of an International Union of Pure and Applied Chemistry (IUPAC) group 2 element, an oxide of an IUPAC group 3 element, and titanium oxide.

18. The semiconductor device of claim 15, wherein the gate stack has a bottom surface with a stepped profile, with the bottom surface of the first portion of the gate stack having a greater height than the bottom surface of the second portion of the gate stack.

19. The semiconductor device of claim 18, wherein the bottom surface of the gate stack includes a height transition region between the first portion of the gate stack and the second portion of the gate stack.

20. The semiconductor device of claim 15, wherein the semiconductor channel is a semiconductor fin.

\* \* \* \* \*